Jan. 10, 1961 R. B. BROWN 2,967,951
DIRECT-COUPLED TRANSISTOR CIRCUIT
Filed Jan. 17, 1955 2 Sheets-Sheet 1

INVENTOR.
RALPH B. BROWN
BY
Glenn V. Hazeltine
ATTORNEY

DIRECT-COUPLED TRANSISTOR CIRCUIT

Filed Jan. 17, 1955

2 Sheets-Sheet 2

INVENTOR.
RALPH B. BROWN
BY
Allen V. Hazeltine
ATTORNEY

United States Patent Office 2,967,951

Patented Jan. 10, 1961

2,967,951

DIRECT-COUPLED TRANSISTOR CIRCUIT

Ralph B. Brown, Philadelphia, Pa., assignor to Philco Corporation, Philadelphia, Pa., a corporation of Pennsylvania Filed Jan. 17, 1955, Ser. No. 482,344

17 Claims. (Cl. 307—88.5)

This invention relates to electrical circuits employing semiconductive devices, and particularly to amplifying and switching circuits utilizing transistors as the active elements thereof.

Semiconductive devices providing circuit gain have been utilized in the past both for switching and for small-signal amplification. Conventionally, the transistor is connected in the circuit with its emitter biased in the forward direction with respect to its base and its collector biased in the reverse direction with respect to the base, and variations in emitter-to-base current are utilized to control the reverse current of the collector. One general class of circuit configurations in which such devices have been used is commonly designated the "common emitter" connection, in which the emitter circuit is common to the input and output circuits. Common-emitter amplifying stages are particularly useful because of the relatively large gain which they provide, and may be used either in large-signal switching circuits such as multivibrators or trigger circuits, or alternatively in small-signal circuits such as linear amplifiers for example. Where more than one such stage is used, the transistors have either been A.-C.-coupled by means of appropriate coupling networks involving series capacitors or transformers, or have been D.-C.-coupled by means of interstage networks relying upon resistive connection between stages or appropriate biasing means to provide suitable adjustment of the D.-C.-levels in the coupled stages. In each of these circuit arrangements, at least one of the stages employs circuit elements in addition to the load device in order to provide substantial circuit gain.

In circuits such as the foregoing it is generally desirable to reduce the number of components to as small a number as possible, in the interests both of economy and reliability. Particularly in computer applications, in which there are typically employed large numbers of circuits in a single apparatus, circuit simplification is of especially great importance, but it is obviously also of importance in any device intended for practical use.

Accordingly, it is an object of my invention to provide new and improved electrical circuits utilizing semiconductive amplifying devices.

A further object is to provide a new and improved circuit utilizing interconnected semiconductive amplifying devices.

Still another object is to provide a direct-coupled transistor circuit of great simplicity.

It is a further object to provide an improved switching circuit utilizing semiconductive amplifiers.

Another object is to provide improved multivibrator circuits using semiconductive amplifiers as the active elements thereof.

More specific objects are to provide new and improved forms of monostable, bistable and astable multivibrators.

It is another object to provide such circuits which are characterized by extreme simplicity of configuration and economy of parts.

The above objectives are achieved in accordance with the invention in one aspect by utilizing a circuit comprising at least a first and a second common-emitter transistor amplifying stage, with the collector of the first stage directly coupled to the base of the second stage, and with the emitters of the two stages operating at the same bias potential, such as ground for example. Biasing potential is supplied to the collector-base interconnection through an appropriate impedance. The transistors employed in these stages are so characterized that the operating range of base voltages for the second transistor includes at least some values within the gain-producing range of collector voltages of the first transistor. Using this connection and such transistors, I have found that new and improved circuits of especially simple form may be provided. For example, circuits utilizing but a single resistor per transistor may be employed in switching and/or amplifying applications with excellent operational results.

Further in accordance with the invention in another aspect, I have found that certain types of transistors specified hereinafter in detail will provide signal gain when the collector-to-base voltage thereof is zero or even in the direction of forward bias, so long as the collector voltage is of the appropriate polarity with respect to the emitter voltage to attract minority-carriers thereto. Utilizing this discovery, I have found that transistor circuits for switching, amplifying or other signal-translating applications may be constructed with what appears to be the ultimate in simplicity. For example, in a preferred embodiment of my invention I employ a plurality of such transistors in the above-mentioned direct connection, in which case the transistors may be similar or substantially identical in their electrical characteristics. With this arrangement large numbers of substantially identical transistor stages, each in the common-emitter connection, and each comprising a transistor, a direct connection from the emitter to a common reference potential such as ground, and a single biasing or load resistor between the collector and a common supply potential may be operated as a D.-C.-amplifier of excellent characteristics by connecting the collector of one stage directly to the base of the succeeding stage. As will be demonstrated in detail hereinafter, such direct cascading of stages may be employed for large-signal amplification, for small-signal amplification, or the output of one stage may be coupled directly to the input of a preceding stage to obtain regenerative action for multivibrator purposes for example.

In addition, it is often advantageous to employ a single amplifying or switching stage utilizing a transistor having the above-described characteristics, whereby the device is operable with substantial gain under the condition that its collector and base voltages are identical. In this circuit the same supply potential which is utilized for the collector circuit may be utilized for the base circuit, with consequent simplification in biasing apparatus as will also be described in detail hereinafter.

These and other advantages and features of my invention will be more fully comprehended from a consideration of the following detailed description in connection with the accompanying drawings, in which.

Figure 2:
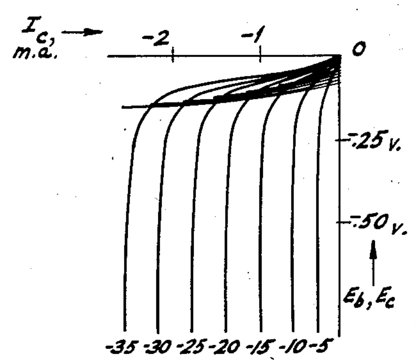
Figure 2 is a graphical representation of certain characteristics of a germanium PNP junction transistor suitable for use in the circuit of Figure 1.
Figure 4:
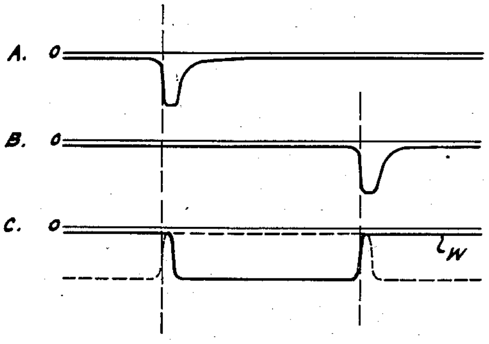
Figure 10:
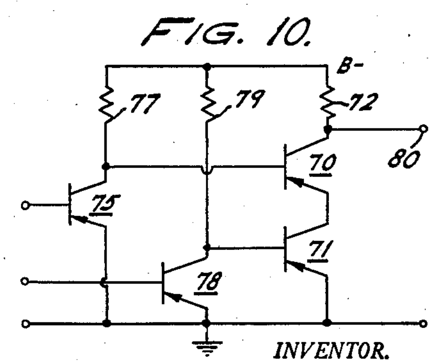
Figure 5:
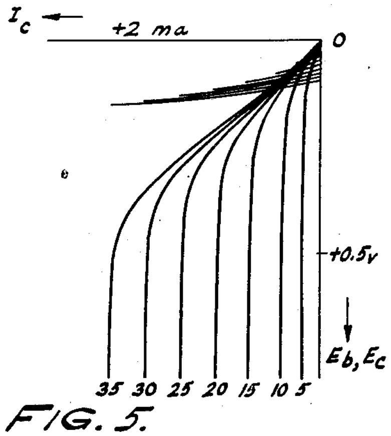
Figure 6:
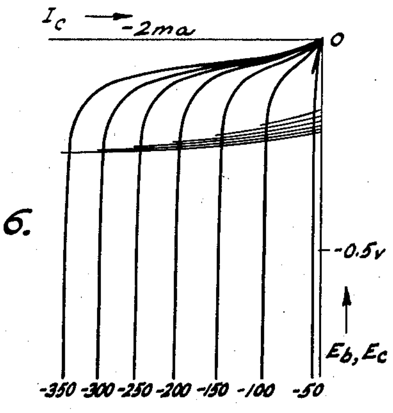
Figure 7:
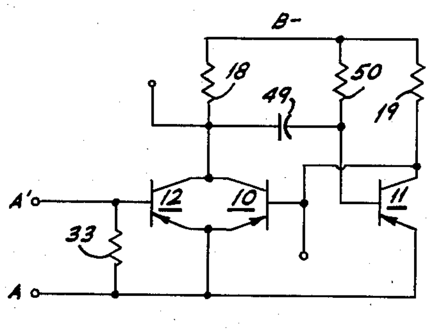
Figure 8:
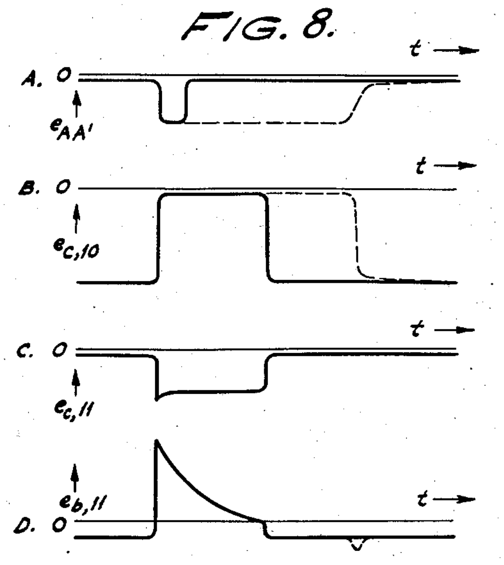
Figure 9:
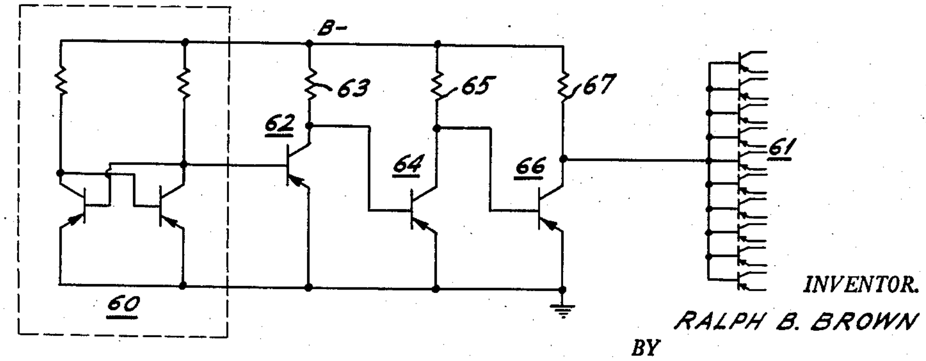

Figure 4 comprises a group of graphical representations to which reference will be made in explaining the operation of the circuit of Figure 1;

Figure 5 is a graphical representation of the same characteristics as are shown in Figure 2, but for an NPN grown-junction transistor;

Figure 6 illustrates graphically these characteristics for an N-type surface-barrier transistor;

Figure 7 is a schematic diagram of a monostable multivibrator circuit embodying the invention;

Figure 8 is a graphical representation showing certain waveforms produced by the multivibrator of Figure 7;

Figure 9 is a schematic diagram of a direct-coupled amplifier embodying the invention; and Figure 10 is a schematic diagram of another transistor circuit embodying the invention in one aspect thereof.

Figure 1:
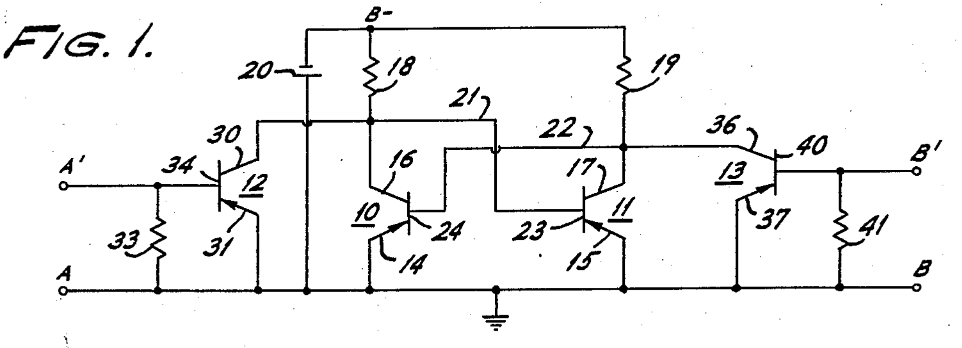
Figure 1 is a schematic diagram of a bistable multivibrator embodying the invention in one form.

Turning now to a detailed consideration of the embodiment of my invention shown in Figure 1, transistors 10 and 11 are the active elements of a novel bistable multivibrator circuit arranged in accordance with the invention, while transistors 12 and 13 are the active elements of suitable stages for effecting triggering of the multivibrator from one stable state to the other.

The multivibrator portion of the circuit comprises the two transistors 10 and 11, each in the common-emitter connection and with their emitters 14 and 15 at the same potential, which in the example shown is ground potential. The necessary characteristics of these transistors will be described fully hereinafter, and for the present it will be sufficient to indicate that they may typically be substantially identical and in the present example the base material thereof is N-type semiconductor. The collectors 16 and 17 of transistors 10 and 11 are connected through resistors 18 and 19, respectively, to a common source of negative potential 20. Direct cross-connections 21 and 22 of substantially zero impedance are provided between the collector of transistor 10 and the base of transistor 11, and between the collector 17 of transistor 11 and the base 24 of transistor 10, respectively. Aside from these interconnections, the entire multivibrator circuit is therefore seen to comprise only the two transistors 10 and 11, the two resistors 18 and 19, and the common source of potential difference 20.

As will be described more fully hereinafter, the multivibrator shown in Figure 1 has two stable conditions, one in which the transistor 10 conducts more heavily than transistor 11, and the other in which transistor 11 conducts more heavily than transistor 10. For convenience, the condition of heavier conduction will be designated hereinafter the "On" condition of a transistor, and the condition of less conduction will be termed the "Off" condition.

The triggering circuit for placing the multivibrator in the condition in which transistor 10 is in its "On" state comprises transistor 12, the collector 30 and emitter 31 of which are directly connected to the corresponding elements of transistor 10, and a trigger-input load resistance 33 here shown connected between the base 34 of transistor 12 and ground. It will be understood that resistance 33 may comprise the internal resistance of the source of actuating signals, and may for example represent the D.C.-resistance of the collector of another transistor. In the absence of trigger signals applied to the trigger terminals AA′, the base of transistor 12 is therefore at the same potential as the emitter thereof, and the collector of transistor 12 presents a high impedance in parallel with the collector of transistor 10. However, when a negative pulse of sufficient amplitude is applied to trigger terminals AA′, transistor 12 becomes highly conductive and is effective to trigger transistor 10 to its "On" condition.

Similarly, the trigger circuit for placing transistor 11 in its "On" condition comprises transistor 13, the collector 36 and emitter 37 of which are connected directly to the corresponding elements of transistor 11. The base 40 of transistor 13 is connected to ground through another trigger input load resistor 41, and negative pulses applied to trigger terminals BB′ are therefore effective to place transistor 11 in its "On" condition.

To make entirely clear the mode of operation and range of variation of the several parameters of the circuit of Figure 1, it will be convenient first to describe the structure and operation thereof with reference to one specific embodiment, as follows.

In a representative embodiment, each of the transistors 10, 11, 12 and 13 may comprise a type 2N62 germanium alloyed-junction, PNP transistor typically having the electrical characteristics represented in Figure 2. The lines in Figure 2 extending downwardly and identified by the numbers −5, −10 etc. are the so-called collector characteristics of the transistor obtained by plotting the variation of collector voltage with collector current for fixed values of base current. The lines extending generally horizontally are the so-called base characteristics of the transistor, indicating the manner in which the base voltage varies as the collector characteristics are produced. Thus ordinates in Figure 2 represent the collector voltage or base voltage of the transistor in volts, while abscissae represent the corresponding collector current in milliamperes. The first collector-voltage curve to the left of the ordinate axis designated by the number −5 is obtained with a base current of −5 microamperes, and successive collector curves to the left of this curve correspond to base current increments of −5 microamperes, as represented by the abovementioned identifying numbers.

The base voltage characteristics also comprise a family of curves, one corresponding to each of the several values of base current utilized in obtaining the collector characteristics. The lowest base-voltage curve, which also extends farthest to the left and terminates immediately above the vertical portion of the −35 microamperes collector-voltage curve, is that obtained for −35 microamperes of base current. The base-voltage curve for progressively smaller values of base current are progressively higher and in each case terminate immediately above the vertical portion of the collector characteristic obtained for the same value of collector current.

By plotting the collector and base characteristics on the same graph and with the same collector-current scale, as in Figure 2, the existence or non-existence of the necessary and desired attributes of a transistor suitable for use in direct-coupled circuits such as that of Figure 1 is readily displayed. As will be shown hereinafter, at substantially all times in the operation of the circuit of Figure 1 one or the other of the two transistors 10 and 11 is operated with its collector biased in the forward direction with respect to the base thereof. Transistor gain may be obtained under such circumstances if the base-voltage characteristics extend sufficiently in the negative direction to provide a region on at least one of the collector characteristics lying above the base-voltage curves, in which region operation of the transistor with substantial gain may take place. The gain-producing capabilities in this region in turn are indicated by the horizontal spacings of the collector characteristics therein, the greater the spacings the greater the available gain.

The curves in Figure 2 show that as the base current is increased negatively in the germanium alloyed-junction transistor whose characteristics are represented, the maximum base voltage increases negatively more and more slowly, and for this transistor cannot decrease below about 0.25 volt without producing currents so high as to damage the transistor. However, the lower base voltage curves include values of base voltage which are sufficiently low to lie below a range on the collector characteristics for which transistor gain may be obtained. It is therefore possible with these transistors to utilize the same voltage for the base of one transistor and for the collector of another transistor, and still to obtain substantial gain from the transistors.

The two stable states for the multivibrator of Figure 1 with the circuit values described in the present specific embodiment are as follows. The "On" transistor has a collector voltage of −.03 volt, a base voltage of −.33 volt, a collector current of −1.48 milliamperes and a base current of −1.14 milliamperes; the "Off" transistor has a collector voltage of −.33 volt, a base voltage of −.03 volt, a collector current of −.06 milliampere and a base current of about −3 microamperes.

To reverse the conduction states in the two transistors, the trigger pulse applied to the collector of the "Off" transistor may be such as to raise the collector voltage thereof substantially to ground, for example to about −.03 volt. Thus when transistor 10 is initially "Off" and transistor 11 is "On," a trigger pulse on collector 16 of transistor 10 sufficient to increase the collector voltage thereof, and the base voltage of transistor 11, to about −0.03 volt is operative when applied for a suitably long interval to greatly reduce the collector current of transistor 11, with the result that the collector voltage of transistor 11 and hence the base voltage of transistor 10 falls to about −.33 volt, in which condition transistor 10 is turned "On." When the trigger pulse terminates, each transistor is then left in the opposite conduction state, with transistor 10 "On" and transistor 11 "Off." A negatively-directed pulse of about 15 microseconds duration and .15 volt amplitude applied to trigger terminals AA′ is sufficient to turn transistor 10 "On" and to turn transistor 11 "Off" in this manner, while a similar pulse applied to trigger terminals BB′ will turn transistor 11 "On" and transistor 10 "Off."

Figure 3:
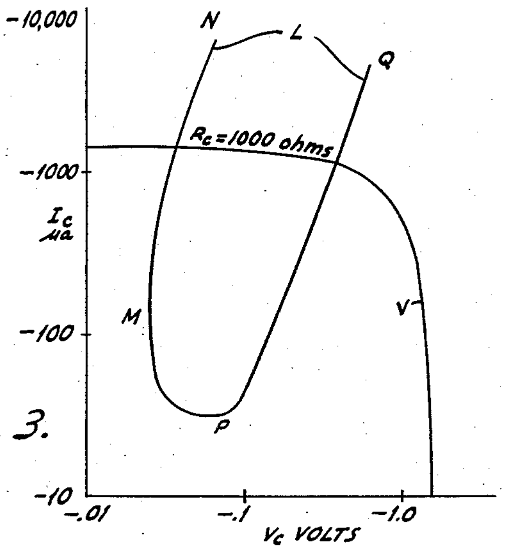
Figure 3 is a graphical representation showing the negative-resistance characteristics of the circuit of Figure 1.

Figure 3 illustrates the factors affecting bistable operation from another aspect. In the latter figure, the two possible values of current through one of the collector load resistors of the bistable multivibrator of Figure 1 are plotted vertically in negative microamperes to a logarithmic scale, while the corresponding negative collector voltages of the same transistor are plotted in volts to a logarithmic scale in the horizontal direction. The curve L is then the locus of the pairs of possible values of current through one collector resistor and collector-voltage for the same transistor, for various values of the collector load resistors 18 and 19 in Figure 1. For example, curve V is the load line for collector resistors at 1,000 ohms, and intersects the characteristic curve L at approximately 1.4 milliamperes and 1.1 milliamperes, corresponding to the above-mentioned "On" and "Off" values of current through the collector resistor. The slope of the curve L at any point therefore represents the resistance of the circuit in the condition indicated. The rising portion of the curve L in the region MN of positive-slope indicates the values of collector voltage and collector current obtained with various collector resistances in the "On" condition of the transistor, the rising portion of curve L in the other positive-slope region PQ represents the corresponding collector voltage and collector-resistor current for the "Off" condition of the same transistor, while the intermediate portion of the curve in the region PM is the negative-resistance portion of the characteristic. The function of the triggering pulses applied to terminals AA′ and BB′ in Figure 1 is to force the operating point of the transistor from one to the other of the positive-resistance portions of the characteristic L.

In the present example the uppermost portions of the characteristic L which are shown in Figure 3 correspond to collector resistors of about 160 ohms, while those near the bottom of the characteristic correspond to collector resistors of about 50,000 ohms. Actually, the upper portion of the characteristic curve L may be continued to substantially lower values of load resistance, and will form a closed curve. For example, collector resistances of about 50 ohms provide entirely satisfactory operation.

The form of the lower extreme of the curve L should be understood to be illustrative only, since in the vicinity of point P the device tends to become unstable and accurate measurements become difficult.

A brief consideration of the arrangement of Figure 1 in the above-mentioned typical operating conditions of the bistable multivibrator will show clearly that, since the collector of each transistor is directly connected to the base of the other transistor, the collector-to-base voltage of one transistor is the negative of the collector-to-base voltage of the other transistor at any given time. The circuit therefore relies for its operation upon the operativeness of the transistors with the collectors biased forward with respect to their respective bases, as well as with the collectors biased in the conventional direction with respect to their bases.

This mode of operation is illustrated in more detail in Figure 4, wherein abscissae represent time and ordinates represent signal amplitude. At A of Figure 4 there is represented a typical trigger pulse suitable for application to trigger terminals BB′ to turn transistor 10 "Off" and to turn transistor 11 "On." At B there is shown a corresponding pulse suitable for application to trigger terminals AA′ to cause the multivibrator to revert to its original condition in which transistor 10 is conducting heavily. At C, the solid line W represents the collector voltage of transistor 10, which is also the base voltage of transistor 11, and also shows by the broken line the collector voltage of transistor 11, which equals the base voltage of transistor 10. The horizontal line O in each case indicates the line of zero potential with respect to emitter.

In the operation exemplified, the multivibrator is initially in the condition in which transistor 10 is "On" and transistor 11 is "Off"; as shown by the solid line W in Figure 4, the collector voltage of transistor 10 is initially near zero, e.g. −.03 volt, while the collector voltage of transistor 11 as shown by the broken line is relatively highly negative, e.g. −0.33 volt. However, upon the occurrence of the negative trigger pulse at terminals BB′, as shown at A in Figure 4, the collector voltage of transistor 11 and the base voltage of transistor 10 are driven positively up to approximately −0.03 volt. Since the base voltage of transistor 10 has been raised almost to the emitter voltage thereof, the transistor 10 is thereby substantially cut off, and the collector voltage thereof and hence the base voltage of transistor 11 change in the negative direction to the value −0.33 volt. Upon the termination of the trigger pulse, then, the multivibrator has changed to its other condition and remains so until the trigger pulse occurs at terminals AA′, at which time the reverse process occurs and the multivibrator is actuated to its original condition.

It will be appreciated that, since the base of either transistor is at the same potential as the collector of the other, the solid curve W shown at C of Figure 4 represents not only the collector voltage of transistor 10 but also the base voltage of transistor 11, and the dotted curve represents not only the collector voltage of transistor 11 but also the base voltage of transistor 10. As is shown clearly by the figure, except at the points of intersection of the curves one or the other of the transistors is always operating with its collector biased in the forward direction with respect to its base, and at the points of intersection the collector and base voltage are equal. At no point in the complete cycle are both transistors operated in the conventional manner with collector reverse-biased with respect to base.

Considering now the variations in the several parameters of the circuit of Figure 1 which may be desired for various applications, it is a feature of my invention that, when transistors having a suitable relation between collector and base characteristics are utilized, the circuit is highly non-critical as to circuit values. The only circuit elements employed are the collector resistors and the source of potential difference, and either or both of these may be varied over relatively large ranges. For example, the collector resistors 18 and 19 may, in the embodiment shown, typically have values as low as about 50 ohms and as high as about 50,000 ohms, providing that the dissipation of the transistors is not exceeded. Similarly, the bistable multivibrator will operate satisfactorily with supply voltages as low as —0.2 volt, or at supply voltages many times greater, e.g. —45 volts.

As to the type of transistor employed, any transistor which will operate and provide some degree of gain with its collector forward-biased with respect to the base thereof may be utilized in such circuits. This will ordinarily mean that the base-voltage curves such as those illustrated in Figure 2, for the transistor in question, should indicate the possibility of utilizing base voltages at least as negative as a value which, when utilized as a collector voltage, will provide adequate gain in the transistor. Thus far it has been found that substantially all of the commercial alloyed-junction transistors are suitable for this purpose, and that the surface-barrier transistor is particularly adapted for this operation. The latter type of transistor is described in detail in the copending application Serial No. 472,826 of R. A. Williams and John W. Tiley entitled "Electrical Device" and filed December 3, 1954. However, all known commercial types of grown junction or point-contact transistors have been found unsuited for this purpose. For example, there are shown in Figure 5 the collector characteristics, extending generally downwardly, and the base characteristics, extending generally horizontally, for a typical NPN grown-junction transistor, plotted to the same scale and for the same base currents as Figure 2 but with opposite polarities because of the opposite conductivity-type of the transistor. It will be seen from Figure 5 that the maximum values of base voltage obtainable with this device are still not sufficiently great to provide a collector voltage which would be suitable for operating the transistor with useful gain.

As to the trigger requirements for the arrangement of Figure 1, as indicated before I prefer to trigger the device by applying sufficient voltage to the base of the "On" transistor, and for a sufficient time, to reduce the current in the collector circuit of the "On" transistor to the low value which it possesses in its "Off" state. The exact values of trigger pulse amplitude and duration which are preferred in any particular application may readily be determined by experiment. However, as shown by Figure 3, for reliable triggering the amplitude of the trigger pulse should be at least sufficient to reduce the collector voltage of the "On" transistor from its "On" value in the region MN of curve L, to a voltage on the opposite side of the negative-resistance region MP of the same curve. Furthermore, the duration of the pulse, considered in conjunction with its amplitude, should be sufficient to permit removal of the excess current-carriers normally present in the "On" transistor due to saturation, and to modify the collector voltage of the "On" transistor in the desired manner. Typically, for a germanium-alloy transistor such as the type 2N62, a 15-microsecond negative pulse of 0.15 volt amplitude applied to either of the trigger terminals will be entirely satisfactory to actuate the multivibrator from one state to the other, although even smaller pulses may be used successfully. In general, when the collector resistors are made larger, the required trigger voltage decreases. For example, with 57-ohm collector resistors a trigger-pulse amplitude of 0.39 volt is appropriate, while with collector load resistors of 10,000 ohms, 0.09 volt is entirely adequate.

As examples only of the operation of this circuit with different circuit values, the bistable multivibrator may employ 150-ohm collector resistors with 2N62 type transistors, in which case the "Off" collector current will be 5 milliamperes and the "Off" collector voltage 0.65 volt, while the "On" collector current will be 8.5 milliamperes and the "On" collector voltage 0.07 volt. On the other hand, if the collector resistors are 36,000 ohm resistors, the "Off" collector current will be 36 microamperes and the "Off" collector voltage 0.093 volt, while the "On" collector current will be 37 microamperes and the "On" collector voltage .035 volt. With the same 2N62 type transistor, supply voltages as low as —0.2 volt have been utilized, the lower limit being set primarily by the decrease in the alpha of the transistors which occurs as the supply voltage is made lower. The supply voltage may be increased to large values such as —45 volts, with corresponding increases in the resistances in the collector to limit the currents appropriately.

When employing a typical surface-barrier transistor utilizing N-type germanium of approximately 1 ohm-centimeter resistivity and emitter and collector contacts of indium in circular form having respective diameters of about 4 and 7 mils, and with collector resistors of 1500 ohms and a supply potential of −1.5 volts, the following operating conditions for the bistable multivibrator will exist. In the "On" condition, the collector current will be about 900 microamperes and the corresponding collector voltage about −0.15 volt, while the "Off" collector current will be about 650 microamperes and the "Off" collector voltage will be about −0.52 volt.

In Figure 6 there are shown the collector characteristics and the base characteristics for such a surface-barrier transistor, utilizing the same scale as for Figure 2. In this case it is noted that the base voltages obtainable are relatively highly negative compared to the knee in the collector-current characteristics of the device, and that operation is therefore possible in the region of the collector characteristics for which substantially full gain exists.

The operation of the circuit of Figure 1 when surface-barrier transistors are used is basically similar to that described in detail for the particular case of the germanium alloyed-junction transistor. However, in the case of the surface-barrier transistor embodiment of the device, substantially shorter trigger pulses may be utilized, 0.2 microsecond actuating pulses for example being suitable. The rise and fall times and minimum durations of the pulses produced by the multivibrator may also be substantially shorter with this form of semiconductive amplifier, e.g. less than about 0.1 microsecond.

With either the alloyed-junction transistor or the surface-barrier transistor, output may be taken from either collector, and current drains as great as 1 milliampere may be drawn from the output connection without upsetting the operation of the device.

Although I prefer to utilize collector resistors of equal values in the two transistors comprising the bistable multivibrator, substantial departures from equality in these values are permissible, and satisfactory operation may be obtained, for example, with a 30% difference in their values.

As shown in Figure 7, wherein numerals corresponding to those of Figure 1 indicate corresponding parts, the bistable multivibrator circuit of Figure 1 may be converted to a monostable multivibrator circuit by placing a capacitor 49 in series in one of the connections from the collector of one transistor to the base of the other transistor, and by adding another resistance 50 between the so-connected base and the source of supply voltage. In this case the trigger pulse is supplied only to that collector which is connected to the coupling capacitor, since the multivibrator returns automatically to its normal conduction state.

In a typical embodiment of the circuit of Figure 7 utilizing the above-mentioned 2N62 germanium alloyed-junction transistors, the collector resistors may again each be 1,000 ohms, and the supply potential for the device −1.5 volts. In this case the second transistor 11 is normally held in heavy conduction by a bias supplied through resistor 50. Typically, transistor 11 will then have a collector voltage of substantially −0.06 volt and a base voltage of about −0.18 volt in the absence of triggering pulses. The first transistor 10, which has a base voltage of about −0.06 volt, will have a collector voltage of approximately −1.4 volts in this example.

A trigger pulse of about −0.25 volt amplitude and at least 1 microsecond duration may suitably be applied to the trigger input terminals AA′, and, after being differentiated by the coupling capacitor 49 and resistor 50, is supplied to the base of transistor 11 as a positive pulse followed by a negative pulse. The positive pulse drives transistor 11 past cutoff, in which condition it remains until the charge on the coupling capacitor 49 has leaked off through resistor 50 to ground, when transistor 11 again begins to conduct and to return to its original condition. During both the time in which transistor 11 is being cutoff and the time during which it is beginning to conduct again, the feedback from the collector of transistor 11 to the base of transistor 10 supplies a regenerative amplifying effect to hasten the action.

The appropriate waveforms existing at various points in the circuit of Figure 7 are shown in the several parts of Figure 8, wherein ordinates represent signal amplitude and abscissae represent time to the same scale. It will be understood that these curves are illustrative only, and not intended to show precise waveshapes existing in any specific embodiment. At A in Figure 8 the solid line represents the waveform of a typical trigger signal suitable for actuating the multivibrator. At B there is shown in solid line the collector voltage of transistor 10 which, prior to the trigger pulse, is at nearly the supply potential, as shown. During this same time interval prior to the occurrence of the trigger pulse, the collector voltage of the normally "On" transistor 11, as plotted at C, is slightly below ground, and the base voltage of transistor 11, as plotted at D, is substantially negative so as to place the transistor in the saturated condition. However, upon the occurrence of the leading edge of the trigger pulse shown at A, the base voltage of transistor 11 rises sharply as shown by the solid line in D, thereby cutting off transistor 11. As this occurs, the collector voltage of transistor 11 and hence the base voltage of transistor 10 change rapidly in the negative direction, causing transistor 10 to begin to conduct and its collector voltage to rise towards zero, as shown at B. The multivibrator remains in this condition with transistor 10 saturated and transistor 11 cut off, until the base voltage of transistor 11, as shown at D in Figure 8, decays to about emitter potential, at which time transistor 11 begins to conduct again, causing its collector voltage to move positively and thereby regeneratively cutting off transistor 10 even further to accelerate the fall of the base voltage of transistor 11. The time required for the base voltage of transistor 11 to fall to emitter potential depends primarily upon the time-constant RC of capacitor 49 and resistor 50 and to a lesser extent upon the value of resistance 18, the pulse width being directly proportional to the value of capacitor 49.

It is one feature of this embodiment of the invention that the trigger pulse may be large compared to the duration of non-conduction in transistor 11 without substantially modifying the pulse produced at the collector of transistor 11, since the pulse resulting from the differentiation of the trailing edge of the trigger pulse is in the positive direction and, since the base of transistor 11 is already conducting heavily, this positive pulse produces only a small variation in base voltage and substantially no change in the collector voltage of transistor 11. Thus, if the trigger pulse has the longer duration represented by the broken line in A of Figure 8, the pulse at the collector of transistor 10 will persist for a corresponding time as shown by the broken line in B of the same figure. However, the negative pip corresponding to the occurrence of the trailing edge of the trigger pulse is small, as shown in broken line at D of Figure 8, and the collector voltage of transistor 11 is substantially free of any perturbation from this source.

In a typical embodiment for producing a pulse of 40 microseconds duration and utilizing germanium alloyed-junction transistors, with colector resistors of 1,000 ohms the resistor 50 may be 1,800 ohms and capacitor 49 may have a value of 0.01 microfarad. If resistor 50 is changed to 20,000 ohms, the pulse width under otherwise identical conditions will be about 200 microsconds. As another example, with resistances of 1,000 ohms in the collector circuits and a capacitor having a value of 0.003 microfarad, pulses of from 60 to 20 microseconds duration may be obtained by varying resistance 50; if the capacity is then doubled to 0.006 microfarad, pulse widths of from 100 to 20 microseconds may be obtained when the value of resistor 50 is varied. Typically, the rise time of the output pulse when utilzing this type of transistor will be of the order of 15 microseconds.

When a surface-barrier transistor of the type referred to hereinbefore is utilized in this circuit, the supply potentials and collector resistors may typically be −1.5 volts and 1K respectively, and a suitable value for the resistor 50 is 8,200 ohms. In this case, with a value of capacitor 49 of 30 micromicrofarads the pulse duration will be of the order of 0.2 microsecond. By changing capacitor 49 to a value of 24,000 micromicrofarads, the pulse duration may be increased to 130 microseconds. With this type of transistor, the rise and fall times are of the order of 0.1 microsecond.

To produce the monostable operation described hereinbefore utilizing the circuit of Figure 7, the resistor 50 is ordinarily sufficiently small to maintain transistor 11 in the saturated condition in the absence of triggering pulses. If resistor 50 is made of such large value that transistor 11 is normally maintained intermediate its cutoff and its saturated condition, the circuit shown may be utilized as an astable, self-oscillating multivibrator circuit. For example, using the surface-barrier transistors described hereinbefore, values of collector resistors 18 and 19 of 510 ohms and 750 ohms respectively, a coupling capacitor 50 of 0.01 microfarad and a value of resistor 50 of 22,000 ohms, the circuit will oscillate without the application of trigger pulses at a frequency of about 28,500 pulses per second, the pulses having amplitudes of about −1.4 volts and a duration of about 12 microseconds at the collector of transistor 10. In connection with the embodiment shown in Figure 7, it is noted that transistor 11 is operated normally with its base more negative than its collector, so that the collector voltage thereof is sufficiently high to maintain transistor 10 in a low-conduction condition. However, even though operated in this unusual manner, the device exhibits the gain necessary to provide regenerative action and monostable operation as described above. Therefore direct connection of the collector of transistor 11 to the base of transistor 10 without requiring additional circuit elements or biasing means is possible, contributing greatly to the simplification of the circuit, as shown.

Although thus far the invention has been described with particular reference to embodiments in which regenerative back-coupling of the output stage to the input stage is utilized, the invention also finds embodiment in circuits of the cascade-type arranged to operate as signal amplifiers. One form of such an arrangement is illustrated in Figure 9, wherein three cascaded, direct-coupled transistor stages are utilized to provide power amplification of the output pulse from a monostable multivibrator such as that shown in Figure 7, so as to provide the current necessary to drive a relatively large number of transistor bases. In this case a multivibrator 60, which may be of the form described hereinbefore with particular reference to Figures 1 and 7 for example, provides an input signal in the form of a negatively-directed pulse with which it is desired to switch to a low-current condition ten normally-conducting, parallel-connected transistors represented generally at 61. As an example only, it will be assumed that it is desired to make available to the bases of the parallel-connected transistors a total current of about 30 milliamperes. Such relatively large currents have been found desirable when driving large numbers of randomly-selected transistors, to provide for the contingency that one or more of the driven transistors will draw an abnormally high base current.

To provide the required current gain, one may employ three cascaded transistor stages, each comprising a single transistor, a single collector load resistor and a common source of supply potential. The three transistors are coupled together by direct connections from the collector of one transistor to the base of the following transistor.

As an example, the transistor 62 utilized in the first stage may again comprise a PNP germanium alloyed-junction transistor of the 2N62 type, with its emitter grounded and its collector connected to a source of −1.5 volts (designated B−) through a collector load resistor 63 which in the present example may suitably have a value of 5,000 ohms. The second stage may comprise a second transistor 64 identical to transistor 62 and connected in an identical circuit except for the value of the collector load resistor 65, which is typically less than that of resistor 63 and in the present application may be about 500 ohms. The third stage, including transistor 66, may again be identical except for the value of collector resistor 67, which is lower than that of either resistor 63 or 65, and in this example may be about 50 ohms.

In the absence of negative pulses from multivibrator 60, the voltage applied to the base of transistor 62 is sufficient to reduce the collector current thereof to a low value, so that the collector voltage is relatively far negative. As a result, the base of transistor 64 is normally sufficiently negative to provide a relatively large collector current therein. Accordingly the collector voltage of transistor 64 is normally sufficiently near ground to maintain the collector current of transistor 66 at a lower value. The collector of transistor 66 is therefore in turn sufficiently negative to produce strong conduction in each of the transistors shown at 61. In brief, therefore, transistor 64 and the ten transistors shown at 61 are normally "On," while transistors 62 and 66 are normally "Off." However, upon the occurrence of the negative pulse from multivibrator 60, the condition of each transistor is reversed and the ten transistors shown at 61 are cut off.

The considerations affecting the current amplification achieved in the circuit of Figure 9 will be appreciated from the following. With a supply potential of −1.5 volts and a value of resistor 67 equal to about 50 ohms, the transistor 66 is capable of controlling the flow of about 30 milliamperes to the ten parallel-connected transistors. Assuming a base-to-collector current gain of 10, which is typical, about 3 milliamperes must then flow into the base of transistor 66 to permit diversion of the 30 milliamperes current from the 10 transistors shown at 61 during the switching pulse. A value of resistor 65 of 500 ohms permits the flow of the required 3 milliamperes. To produce this 3 milliampere current in the collector circuit of transistor 64 in turn requires that about 300 microamperes be supplied to the base thereof, which is possible using a value of 5,000 ohms for collector resistor 63. The corresponding value of 30 microamperes base current for transistor 62 is readily supplied by the multivibrator 60, assuming for example that it has a collector resistor of much less than about 50,000 ohms, which is the usual case. In each stage the load resistor is made as large as is consistent with supplying the following stage with the required base current, since this minimizes the current required to drive the stage and thereby avoids waste of power gain.

Although the circuit arrangement of cascaded transistor amplifying stages shown in Figure 9 may be utilized as indicated above for the purpose of amplifying large signals of such nature as to drive the transistors substantially from their cutoff condition to their saturated conditions, it has been found that this general circuit configuration may also be utilized for small-signal amplification, and even for linear amplification when transistors having certain special characteristics are utilized. For example, the circuit shown in Figure 9 will provide substantially linear amplification when the transistors and collector resistors, as well as the common supply potential, are identical for each stage, and the transistors are of the surface-barrier type described hereinbefore. As will be appreciated from a consideration of the characteristics of the surface-barrier transistor shown in Figure 6, there are values of base voltage which may suitably be applied to the transistor of each stage which, when utilized as the collector voltage for the preceding stage, will provide operation in the linear portion of the collector characteristic of that preceding stage. Therefore, it is possible to direct-couple such surface-barrier transistors utilizing identical stages and only a single resistor per stage, and to obtain linear amplification by this means. As a specific example only, the circuit of Figure 9 may be utilized with collector load resistors 63, 65 and 67 each of about 3,000 ohms and a collector supply voltage for all stages of −1.5 volts, to provide a three-stage gain of about 60 decibels. When so operated, it will be understood that the first transistor 62 is operated in its linear range by supplying a suitable bias to the base thereof, as by connecting a suitable bias resistor between the base and B−. The proper value for such a resistor equals the ratio of the desired operating bias to the required base current, and in the present example may equal about 30,000 ohms assuming that transistor 62 has a collector-to-base current gain of about 10. Other features and permissible variations of this general type of transistor amplifying circuit are described and claimed in the copending application Serial No. 489,153 of Harold J. Paz and Francis P. Keiper, Jr., filed February 18, 1955, and entitled Electrical System.

It is also possible to make advantageous use of the unique operation described hereinbefore, in accordance with which transistors may be operated with the collector biased at zero in the forward direction with respect to the base, in circuits in which the transistors are connected with their emitter-to-collector-current paths in series. By controlling the signals applied to the bases of the several transistors, the current through the combination may be controlled for gating or modulating purposes, for example. Circuits of this general class are described and claimed in the copending application Serial No. 485,661 of M. Rubinoff and W. E. Bradley, filed February 2, 1955, and entitled Electrical System.

One form of such a circuit is shown in Figure 10, wherein transistors 70 and 71 are connected with their emitter-to-collector current paths in series; that is, the collector of transistor 71 is connected to the emitter of collector 70, while the emitter of transistor 71 is connected to a reference potential such as ground and the collector of transistor 70 is connected to a source of supply potential designated B− by way of a suitable load resistor 72. The base of transistor 70 is connected to the collector of a control transistor 75, which is also connected through resistor 77 to the common negative supply potential. The emitter of transistor 75 may be grounded, and actuating signals applied between the base and emitter thereof.

Similarly, the base of transistor 71 may be directly coupled to the collector of transistor 78, which in turn is connected to the source of negative potential through the collector resistor 79. The emitter of transistor 78 may be grounded and the base thereof supplied with a suitable actuating signal.

The general function of the arrangement of Figure 10 when used as a coincidence gate is to provide a relatively large change in the current through collector load resistor 72 when, and only when, negative pulses are supplied to the bases of both of these transistors. Such a device may be utilized as a so-called "AND" gate for computer use, and for this purpose the transistors 75 and 78 may typically each comprise one-half of a bistable multivibrator such as that shown in Figure 1 for example.

In operation, when the bases of actuating transistors 75 and 78 are substantially negative with respect to emitter potential, these two transistors conduct heavily and the collector voltages thereof are substantially at ground voltage, so that transistors 70 and 71 in turn are substantially cut off. Under these conditions, very little current flows through the series load resistor 72 and the potential at output terminal 80 is substantially equal to the supply of voltage. When the base of actuating transistor 75 is caused to approach emitter potential sufficiently closely to reduce the collector flow therein to a low value, the base voltage of transistor 70 becomes sufficiently negative to place it in a conductive, though not necessarily conducting, condition. Similarly, when the voltage at the base of transistor 78 is made sufficiently near to ground, transistor 78 is cut off and transistor 71 is rendered conductive. If the base of both transistors 70 and 71 are simultaneously negative, heavy conduction occurs through the emitter-collector paths thereof and the current through resistor 72 becomes large. The occurrence of a positive voltage pulse at terminal 80 is therefore indicative of the simultaneous occurrence of negative pulses at the base elements of transistors 70 and 71.

As an example, using a value of resistor 72 of about 1,000 ohms, a supply voltage of about −1.5 volts and actuating pulses of about −0.3 volt on the bases of transistors 70 and 71, the output voltage at terminal 80 remains at about −1.5 volts until the actuating pulses occur simultaneously, at which time the output voltage rises abruptly to about 0.1 volt.

In the circuit of Figure 10 it is noted that conduction in the upper transistor 70 requires the emitter thereof to be positive with respect to the base, and since the emitter potential of transistor 70 is the collector potential of transistor 71 and since the base potentials of transistors 70 and 71 are substantially the same upon conduction, the collector of transistor 71 is normally more positive than the base thereof when both transistors are conducting, and the new mode of operating transistors without reverse bias as described hereinbefore is therefore utilized in this circuit also.

Each of the emboodiments of the invention described hereinbefore has been exemplified with particular reference to circuits suitable for use with transistors having N-type base regions, such as PNP alloyed-junction transistors or surface-barrier transistors utilizing N-type germanium. However, each of the circuits so described may instead employ transistors of the opposite conductivity type, e.g. NPN alloyed-junction transistors or P-type surface-barrier transistors, with appropriate reversal of the polarities of the bias and signal potentials in a manner which will be clear to one skilled in the art. In either case, it is one feature of the invention that in any of the circuits described herein, only one conductivity-type of transistor need be utilized.

In the foregoing description of the several illustrative embodiments of the invention, including that of Figure 9, the use of identical transistors has been made possible by operating them at least part of the time with the collector-to-base voltage at zero or in the direction of forward bias. However, cascaded amplifiers of the general type shown in Figure 9 may also be made to operate satisfactorily by using transistors which will not provide useful gain under such conditions of bias, but which differ in their electrical characteristics in such manner that direct-coupling of the form described herein may still be employed. Thus if the collector characteristics of one transistor are compared with the base-voltage characteristics of the immediately succeeding transistor, and there is a range of base voltages suitable for operation of the second transistor which are also suitable as collector voltages for the preceding stage, satisfactory operation may be obtained. For example, a two-stage direct-coupled cascade transistor amplifier may utilize a power transistor such as the Sylvania type 2N68 as the active element of the last stage. Using a supply voltage of 3 volts, such a transistor will operate satisfactorily with a collector current of 300 milliamperes and a corresponding base voltage of about 1 volt. The base-voltage value of 1 volt is entirely satisfactory as a collector voltage for the 2N62 germanium alloyed-junction transistor discussed hereinbefore, and the latter type may therefore properly be utilized to drive the power transistor through direct-coupling of its collector to the base of the power transistor, without additional biasing means other than the normal collector resistor. Since the power transistor will in this case require a base current of about 8 milliamperes, the collector resistor of the driving stage may typically have a value of about 350 ohms.

Although the invention has been described with particular reference to specific embodiments and applications thereof, it will be understood that it is susceptible of embodiment in any of a variety of forms without departing from the spirit thereof. Thus although the emitters of the direct-coupled cascaded stages illustrated are at the same potential so as to permit greatest circuit simplicity, it is also possible to operate such an amplifier in the manner described hereinbefore but with the emitter of one stage biased somewhat further in the forward direction with respect to its base than the emitter of a preceeding stage, while retaining useful gain in both stages.

I claim:

1. A bistable multivibrator circuit comprising a first transistor having at least emitter, collector and base electrodes, and connected in the common-emitter circuit configuration, a second transistor having at least emitter, collector and base electrodes and also connected in the common-emitter circuit configuration, said second transistor being of the same conductivity type as said first transistor, a source of supply potential for said collector electrodes, impedance means connected between said collector electrodes of said transistors and said source of supply potential for supplying operating potential to said collector electrodes, a first direct connection between the emitter electrodes of said first and second transistors, a second direct connection between said collector electrode of said first transistor and said base electrode of said second transistor, and a third direct connection between said collector electrode of said second transistor and said base electrode of said first transistor, said first and said second transistor, said source of supply potential and said impedance means being such that the emitter-to-collector current multiplication factor of each of said first and second transistors is less than one.

2. A circuit in accordance with claim 1, in which said source of supply potential comprises a first terminal at a reference potential and a second terminal at a potential differing from said reference potential, in which said impedance means comprise a first direct-current conductive resistive element connected between said collector electrode of said first transistor and said second terminal of said source of supply potential and a second direct-current conductive resistive element connected between said collector electrode of said second transistor and said second terminal of said source of supply potential, said circuit also comprising means for connecting said first terminal of said source of supply potential to said emitter electrodes of said first and second transistors, said potential at said second terminal being such as to supply to said collector electrodes a potential of the polarity to attract minority carriers emitted by said emitter electrodes.

3. A circuit in accordance with claim 2, comprising also a triggering transistor of the same conductivity type as said first and second transistors and having emitter, collector and base electrodes, said emitter electrode of said triggering transistor being directly connected to said emitter electrode of said first transistor and said collector electrode of said triggering transistor being directly connected to said collector electrode of said first transistor.

4. A plural-transistor switching circuit comprising: a first and a second transistor of the same conductivity type, each of said transistors having emitter, collector and base electrodes; means for operating said emitter electrodes of said transistors at the same potential; a connection of substantially zero resistance from said collector electrode of said first transistor to said base electrode of said second transistor; first impedance means for supplying operating bias to said collector electrode of said first transistor; second impedance means for supplying operating bias to said collector electrode of said second transistor; said first transistor having a collector-to-emitter voltage when saturated in response to a potential applied to said base electrode thereof which when applied directly between said base and emitter electrodes of said second transistor is sufficiently small to cut off substantially all current flow in said second transistor, said first transistor also having a collector-to-emitter voltage when substantially cut off by a potential applied to said base electrode thereof which when applied directly between said base and emitter electrodes of said second transistor is sufficiently large to saturate said second transistor; and means for supplying to said base electrode of said first transistor a signal voltage with respect to said emitter electrode of said first transistor for switching said first transistor from a substantially cut off condition to a saturated condition and from said saturated condition to said cut off condition, whereby said second transistor is varied between its saturated and its substantially cut off condition, the difference between the values of the collector-to-emitter voltage of said second transistor for its saturated and for its substantially cut off conditions being at least as great as a value substantially equal to the difference in base-to-emitter voltage of said first transistor required to switch said first transistor between its saturated and substantially cut off conditions.

5. A circuit in accordance with claim 4 in which said collector electrodes are of the surface-barrier type.

6. A circuit in accordance with claim 4 in which said collector electrodes are of the alloy-junction type.

7. A circuit in accordance with claim 4, in which each of said first and second means is direct-current conductive and comprises a resistor.

8. A circuit in accordance with claim 4, in which said emitter elements are connected directly to each other, and comprising a common source of collector supply potential for said first and second transistors.

9. A circuit in accordance with claim 4 comprising a reactive connection between said collector electrode of said second transistor and said base electrode of said first transistor for supplying to said last-named base electrode signals developed at said collector electrode of said second transistor, and direct-current conductive means connected to said base electrode of said first transistor for normally supplying said base electrode of said first transistor with a bias for which said first transistor is in saturation, thereby to permit monostable multivibrator action in said circuit.

10. A circuit in accordance with claim 9, in which said reactive connection comprises a capacitor connected directly between said collector electrode of said second transistor and said base electrode of said first transistor and in which said direct-current conductive means comprises a resistor connected directly to said base electrode of said first transistor.

11. A circuit in accordance with claim 4 comprising also a reactive connection between said collector electrode of said second transistor and said base electrode of said first transistor for supplying to said last-named base electrode signals developed at said collector electrode of said second transistor, and direct-current conductive means connected to said base electrode of said first transistor for normally supplying said base electrode of said first transistor with a forward bias less than that required to hold said first transistor in saturation and greater than that required to hold said first transistor in its substantially cut off condition, thereby to permit astable multivibrator action in said circuit.

12. A circuit in accordance with claim 11 in which said reactive connection comprises a capacitor connected directly between said collector electrode of said second transistor and said base electrode of said first transistor.

13. A multivibrator circuit comprising a first and a second transistor each having an emitter, a collector and a base electrode, said first and second transistors being of the same conductivity type, first resistive means for supplying operating potential to said collector electrode of said first transistor, second resistive means for supplying operating potential to said collector electrode of said second transistor, means for operating said emitter electrodes of said transistors at the same potential, a first connection of substantially zero resistance between said collector electrode of said first transistor and said base electrode of said second transistor, and a second connection of substantially zero resistance between said collector electrode of said second transistor and said base electrode of said first transistor, each of said transistors being rendered substantially non-conductive by the potential applied to the base electrode thereof from said collector electrode of the other of said transistors when said other transistor is in saturation, and each of said transistors being rendered saturated by the potential developed at said collector electrode of said other transistor when said other transistor is substantially non-conductive.

14. A circuit in accordance with claim 13 in which said first and second transistors are of the alloy-junction type.

15. A circuit in accordance with claim 13 in which each of said transistors is of a type exhibiting signal gain in the common-emitter circuit configuration when its base electrode is biased more strongly than its collector electrode with respect to its emitter electrode.

16. A circuit in accordance with claim 15, in which said emitter electrodes of said first and second transistors are connected directly together and said first and second resistive means comprise resistors connected directly to said collector electrodes of said first and second transistors respectively.

17. A circuit in accordance with claim 13 in which said first and second transistors have substantially identical electrical characteristics.

References Cited in the file of this patent

UNITED STATES PATENTS

| | | |
|---|---|---|
| 2,627,039 | MacWilliams | Jan. 27, 1953 |
| 2,641,717 | Toth | June 9, 1953 |
| 2,644,897 | Lo | July 7, 1953 |
| 2,663,806 | Darlington | Dec. 22, 1953 |
| 2,774,875 | Keonjan et al. | Dec. 18, 1956 |
| 2,806,153 | Walker | Sept. 10, 1957 |

FOREIGN PATENTS

| | | |
|---|---|---|
| 162,171 | Australia | Jan. 21, 1954 |

OTHER REFERENCES

"Circuit Application of Surface-Barrier Transistor," by J. B. Angell and F. P. Keiper, published in proceedings of the I.R.E., December 1953, pages 1709 and 1710.

Electrical Engineering, April 1954, pages 360 to 365, "Transistor Application Fundamentals," by R. F. Shea.

Electronics, August 1953, pp. 172–3, "Junction Transistor Circuit Applications," by P. G. Sulzer.